(12) United States Patent
Brooks et al.

(10) Patent No.: US 11,380,528 B2
(45) Date of Patent: Jul. 5, 2022

(54) PLASMA PROCESSING APPARATUS

(71) Applicant: HZO, Inc., Morrisville, NC (US)

(72) Inventors: Andrew Simon Hall Brooks, Melbourn (GB); Gareth Hennighan, Bassingbourn (GB); Gianfranco Aresta, Hitchin (GB); Richard Anthony Lione, Cambridge (GB); Shailendra Vikram Singh, Cambridge (GB); Siobhan Marie Woollard, Melbourn (GB)

(*) Notice: Subject to any disclaimer, the term of this patent is extended or adjusted under 35 U.S.C. 154(b) by 73 days.

(21) Appl. No.: 16/622,423

(22) PCT Filed: Jun. 13, 2018

(86) PCT No.: PCT/GB2018/051611
§ 371 (c)(1),
(2) Date: Dec. 13, 2019

(87) PCT Pub. No.: WO2018/229482
PCT Pub. Date: Dec. 20, 2018

(65) Prior Publication Data
US 2020/0211828 A1 Jul. 2, 2020

(30) Foreign Application Priority Data
Jun. 14, 2017 (GB) .................................. 1709446

(51) Int. Cl.
*H01J 37/32* (2006.01)
*C23C 16/458* (2006.01)
*C23C 16/509* (2006.01)

(52) U.S. Cl.
CPC .... *H01J 37/32715* (2013.01); *C23C 16/4583* (2013.01); *C23C 16/509* (2013.01); *H01J 37/32532* (2013.01); *H01J 37/32082* (2013.01)

(58) Field of Classification Search
CPC ............. H01J 37/3244; H01J 37/32779; H01J 37/3253; H01J 37/32715; H01J 37/32449; H01J 37/32082; C23C 16/4583; C23C 16/4581; C23C 16/509
See application file for complete search history.

(56) References Cited

U.S. PATENT DOCUMENTS

| | | | | |
|---|---|---|---|---|
| 4,264,393 A | * | 4/1981 | Gorin | ................ H01J 37/32082 156/345.37 |
| 5,685,949 A | | 11/1997 | Yashima | |
| 6,178,919 B1 | | 1/2001 | Li et al. | |

(Continued)

FOREIGN PATENT DOCUMENTS

| EP | 0578011 | 3/1997 |
|---|---|---|
| WO | WO-2009/091189 | 7/2009 |
| WO | WO-2014/173136 | 10/2014 |

OTHER PUBLICATIONS

International Search Report and Written Opinion for PCT Application No. PCT/GB2018/051611, dated Sep. 3, 2018 (9 pages).

*Primary Examiner* — Yuechuan Yu
(74) *Attorney, Agent, or Firm* — Intellectual Strategies

(57) ABSTRACT

A plasma processing apparatus for processing a substrate using a plasma, comprising: a process chamber in which the processing takes place; a plasma source for providing a plasma to the process chamber; a substrate mount within the process chamber for holding the substrate, the substrate mount comprising a surface having a plurality of apertures.

16 Claims, 4 Drawing Sheets

(56) References Cited

U.S. PATENT DOCUMENTS

| | | | |
|---|---|---|---|
| 2003/0022487 A1* | 1/2003 | Yoon | H01L 21/28518 |
| | | | 438/642 |
| 2005/0000450 A1* | 1/2005 | Iizuka | H01L 21/68742 |
| | | | 118/728 |
| 2007/0144671 A1 | 6/2007 | Ohmi et al. | |
| 2008/0066866 A1 | 3/2008 | Kerber | |
| 2010/0101491 A1* | 4/2010 | Aida | H01L 21/68742 |
| | | | 118/502 |
| 2010/0184290 A1 | 7/2010 | Kim et al. | |
| 2011/0272099 A1 | 11/2011 | Kroll et al. | |
| 2012/0115314 A1* | 5/2012 | Sakamoto | C23C 16/24 |
| | | | 438/479 |
| 2014/0251956 A1 | 9/2014 | Jeon et al. | |
| 2015/0340203 A1 | 11/2015 | Matsubara et al. | |
| 2016/0248233 A1 | 8/2016 | Leidig et al. | |

* cited by examiner

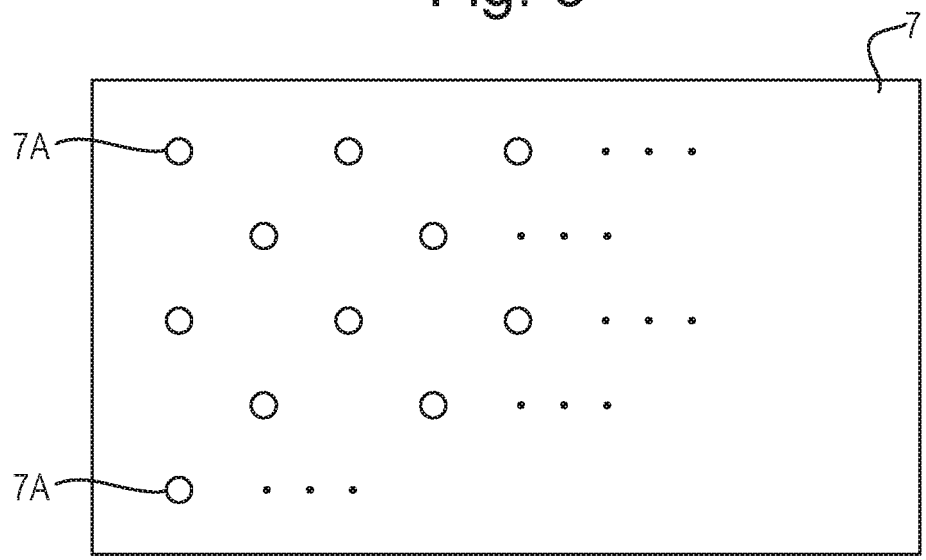
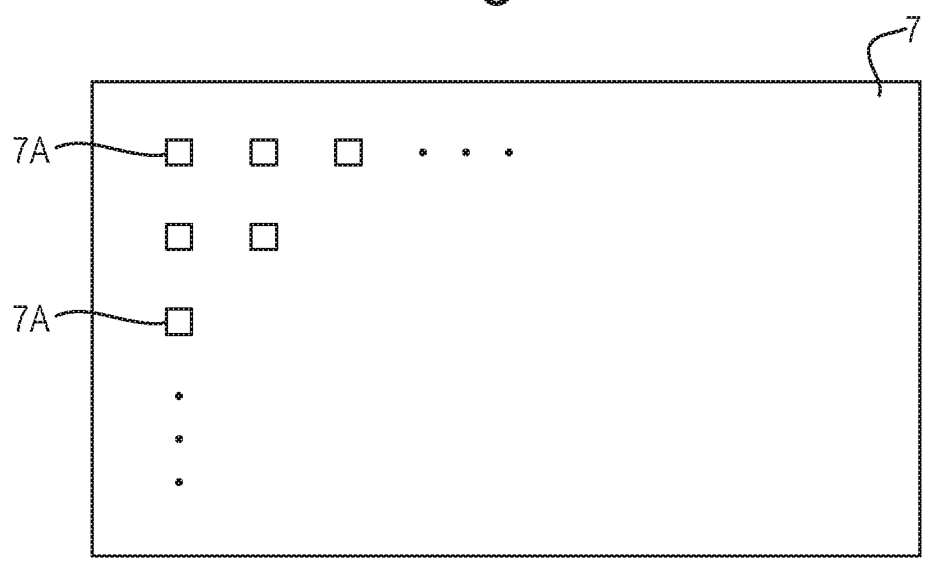

Fig. 5  HMDSO 20 sccm; Ar 20 sccm; 300 W
std. baffle; std injection system
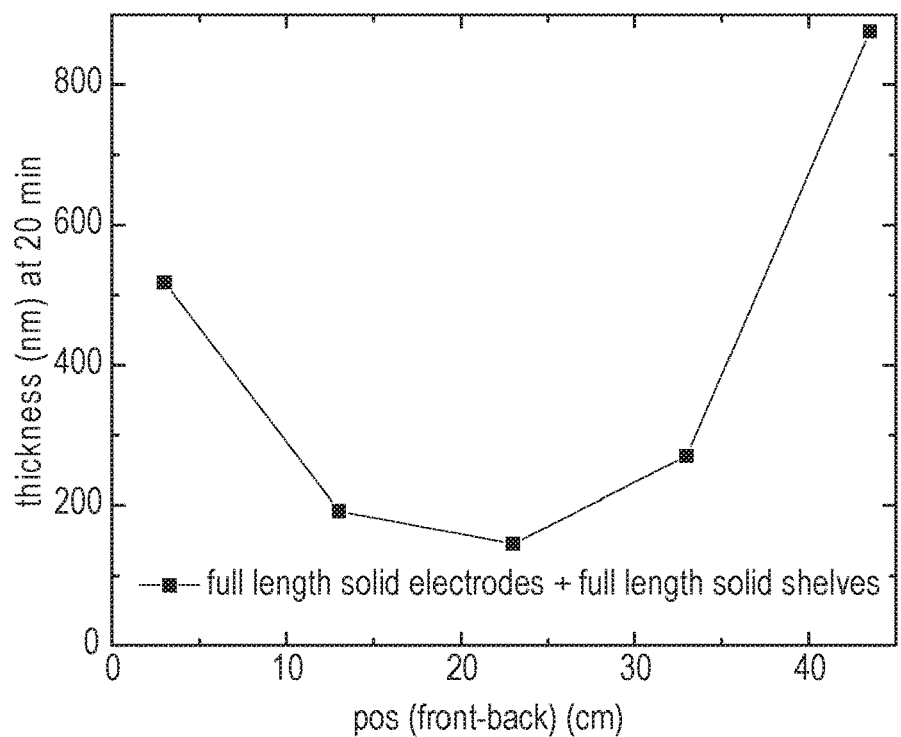
Fig. 6  HMDSO 20 sccm; Ar 20 sccm; 300 W
std. baffle; std injection system
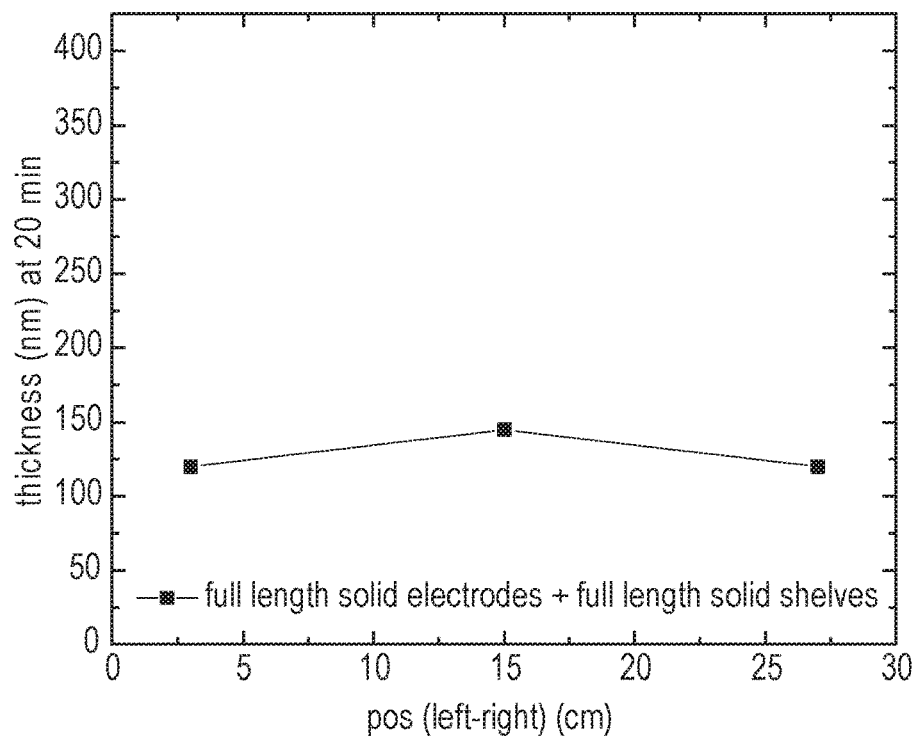

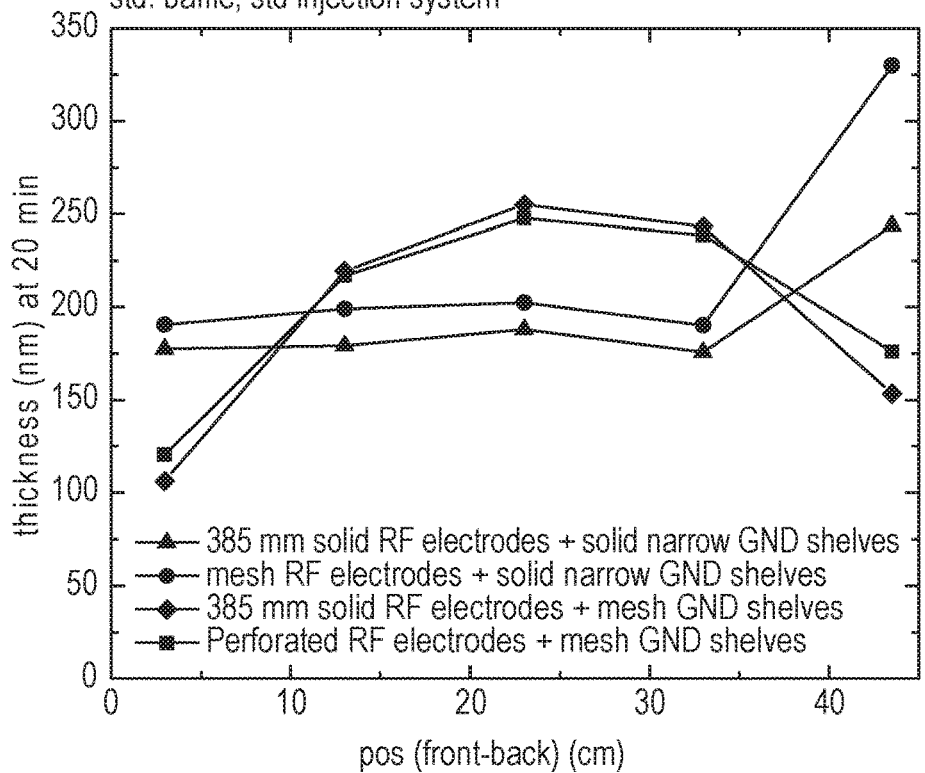
Fig. 7 HMDSO 20 sccm; Ar 20 sccm; 300 W
std. baffle; std injection system
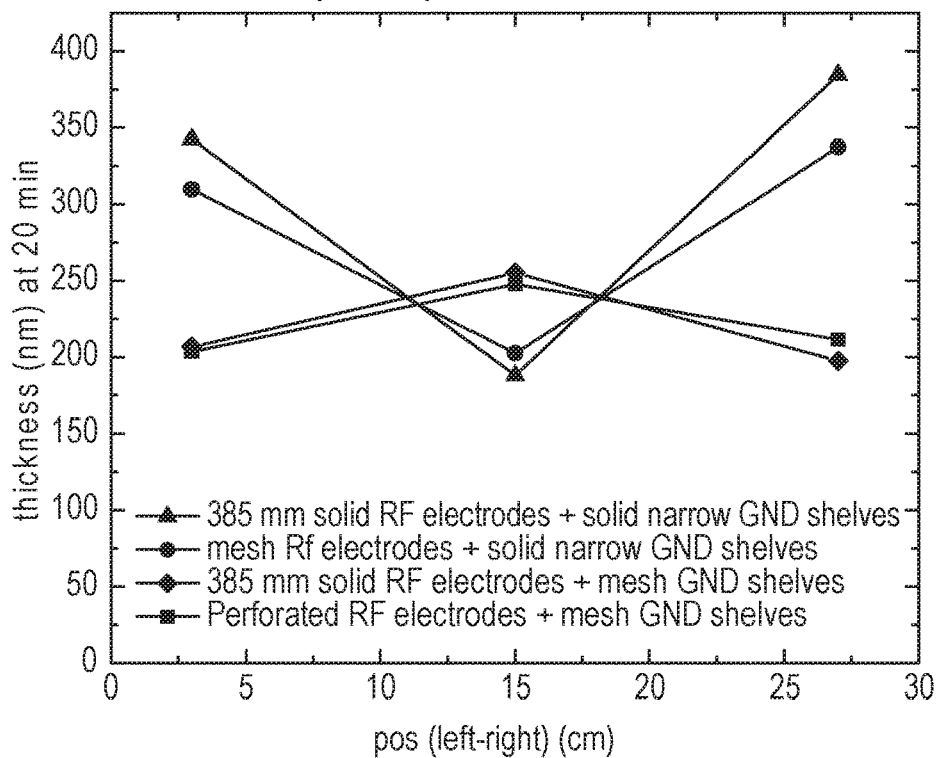
Fig. 8 HMDSO 20 sccm; Ar 20 sccm; 300 W
std. baffle; std injection system

PLASMA PROCESSING APPARATUS

CROSS-REFERENCES TO RELATED APPLICATIONS

This application is a U.S. National Phase Application of PCT International Application No. PCT/GB2018/051611, filed on Jun. 13, 2018, which is an International Application of and claims the benefit of priority to British Application No. GB 1709446.7, filed on Jun. 14, 2017.

The present invention relates to a plasma processing apparatus for processing a substrate using a plasma. One particular embodiment of the invention relates to a plasma deposition apparatus, e.g. for providing a conformal coating to electronic devices, such as printed circuit boards (PCBs).

Plasma processing may include: plasma deposition, plasma surface activation, plasma etching and plasma cleaning, for example. The type of processing is determined by the plasma species generated which is mainly controlled/tuned by the feed gas and or precursor used. Plasma deposition is a known method for providing conformal coatings to substrates, such as electronics. Plasma surface activation is a known method for changing the surface (e.g., energy) properties of a substrate. Plasma etching is a known method for etching patterns in a substrate, e.g. to fabricate integrated circuits. Plasma cleaning is a known method of removing material from the surface of a substrate. Plasma processing apparatuses generally comprise a process chamber, and a plasma source for providing a plasma within the process chamber. A substrate, e.g. PCB, is placed within the chamber and interacts with the plasma, thus, is processed. In the case of plasma deposition for example, a coating of material formed from the plasma is deposited on the substrate.

However, one limitation of plasma processing (e.g. of the conformal coating process by plasma deposition) is a lack of uniformity in the processing (e.g. in the thickness of the coating formed) across the substrate. In the case of plasma deposition for example, the coating thickness may vary undesirably depending on the specific location within the process chamber. This reduces the quality of the coatings due to variation in thickness of the coating over a single substrate and reduces production efficiency due to non-usable areas within the process chamber.

Another limitation of known apparatuses is the rate of processing (e.g. the rate of deposition of material on the substrate) for a given input of plasma precursor, e.g. gas, while maintaining high quality and uniformity.

It is an object of the present invention to address, at least partially, the problems identified above.

An aspect of the invention provides a plasma processing apparatus for processing a substrate using a plasma, comprising: a process chamber in which the processing takes place; a plasma source for providing a plasma to the process chamber; a substrate mount within the process chamber for holding the substrate, the substrate mount comprising a surface having a plurality of apertures.

Optionally, a width of the apertures may substantially correspond to twice the thickness of a plasma sheath formed on the substrate mount. The thickness of the plasma sheath, $S_t$, may be determined by the following relation: $S_t = \lambda_d [q_e V T_e]^{3/4}$, where $\lambda_d$ is the Debye length of the plasma, $q_e$ is the electron charge, V is the electrode voltage amplitude and $T_e$ is the electron temperature.

Optionally, the apertures may have a width of at most 15 mm or at most 10 mm.

Optionally, the apertures may have a width of at least 1 mm or at least 3 mm.

Optionally, the apertures have a width of 8 mm.

Optionally, the apertures in the substrate mount are substantially circular or substantially square.

Optionally, the apertures are substantially uniformly distributed over the surface of the substrate mount.

Optionally, the surface of the substrate mount is substantially sheet-shaped.

Optionally, the substrate mount is a grounded electrode or a floating electrode.

Optionally, the apparatus further may comprises at least one RF electrode for providing an electric field within the process chamber. Optionally, the RF electrode comprises a plurality of apertures.

Further features and advantages of the invention will be described below with reference to exemplary embodiments and the accompanying drawings, in which:

FIG. 1 schematically shows a plasma processing apparatus according to the invention;

FIG. 2 schematically shows a first example substrate mount used in the apparatus of FIG. 1;

FIG. 3 schematically shows a second example substrate mount used in the apparatus of FIG. 1;

FIG. 4 schematically shows a third example substrate mount used in the apparatus of FIG. 1;

FIG. 5 is a graph showing changes in thickness of a conformal coating in a front-to-back direction of the process chamber for a comparative example without apertures;

FIG. 6 is a graph showing changes in thickness of a conformal coating in a left-to-right direction of the process chamber for a comparative example without apertures;

FIG. 7 is a graph showing changes in thickness of a conformal coating in a front-to-back direction of the process chamber for different types of apertures;

FIG. 8 is a graph showing changes in thickness of a conformal coating in a left-to-right direction of the process chamber for different types of apertures.

Figure 1:
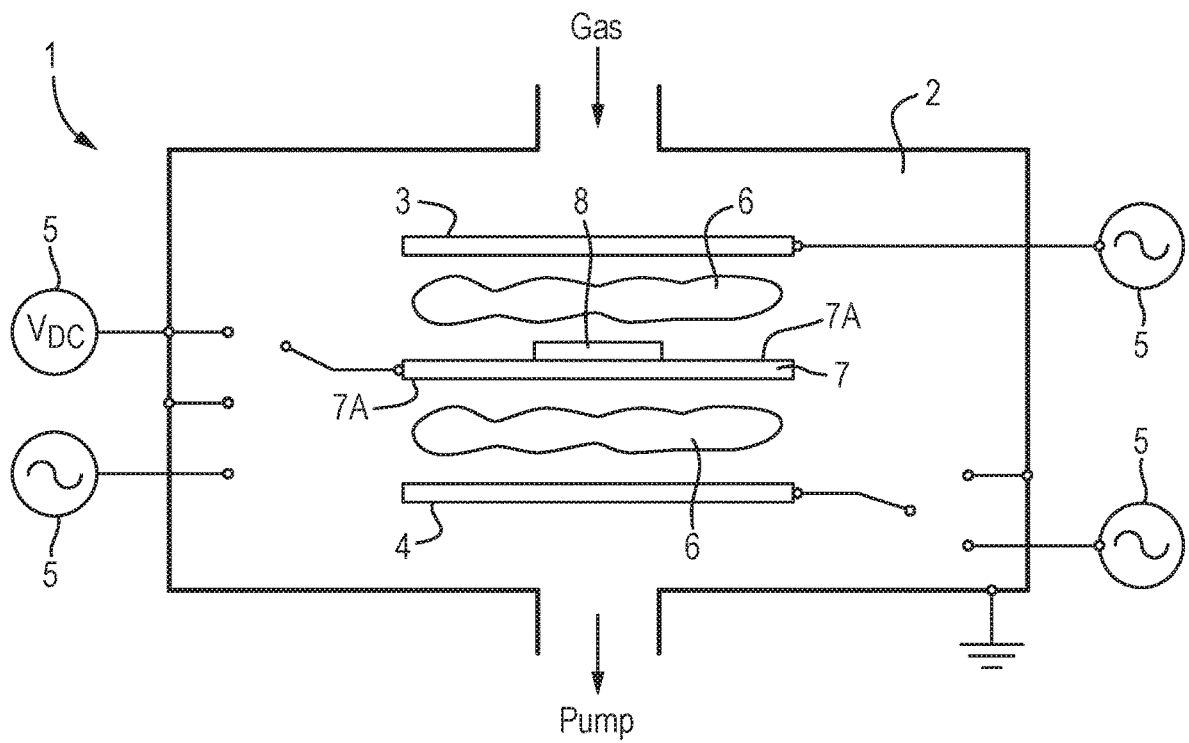

As shown in FIG. 1, in an embodiment of the invention, the plasma processing apparatus 1 for processing a substrate using a plasma generally comprises a process chamber 2 (in which the processing takes place) and a plasma source 3, 4, 5 for providing a plasma 6 to the process chamber 2. The plasma processing apparatus 1 may be a plasma deposition apparatus, a plasma surface activation apparatus, a plasma etching apparatus or a plasma cleaning apparatus, for example.

The plasma source 3, 4, 5 may comprise an energy source 5. The energy source 5 may include any suitable device configured to convert one or more input materials, e.g. gases, to a plasma 6. The energy source 5 may comprise a heater, radio frequency (RF) generator, and/or a microwave generator. The plasma 6 provided to the process chamber 2 by the plasma source 3, 4, 5 may comprise ionized and neutral gases, ions, electrons, atoms, radicals and/or other plasma generated neutral species.

The plasma source 3, 4, 5 may comprise a first electrode 3 which may be placed within or outside of the process chamber 2. The energy source 5 may be connected to the first electrode 3. The first electrode 3 is not limited in its shape, for example, it may be planar plate or helical. The plasma source 3, 4, 5 may comprise a second electrode 4 within the process chamber 2. The energy source may be connected to the second electrode 3. The second electrode 3 is not limited in its shape, for example, it may be planar plate or helical. The second electrode 4, may alternatively be an electrically floating or electrically grounded electrode.

The plasma processing apparatus 1 may also comprise a vacuum system (not shown). The vacuum system is configured to provide a vacuum to the process chamber. Typically, the process chamber 2 is evacuated to pressures in the range of 10-3 to 10 mbar. One or more input materials, e.g. gases, is typically then input, e.g. injected at controlled flow rate, into the process chamber 2. The plasma source 3, 4, 5 generates a stable gas plasma 6.

One or more precursor compounds may then be introduced, e.g. as gases and/or vapours, into the plasma phase 6 in the process chamber 2. Alternatively, the precursor compounds may be introduced first, with the stable gas plasma 6 generated second. When introduced into the plasma phase 6, the precursor compounds are typically decomposed (and/or ionized) to generate a range of active species (i.e. radicals) in the plasma 6. These active species process the substrate. For example, in the case of a plasma deposition apparatus, active species are deposited onto and form a layer on the exposed surface of the substrate 8.

In the case of a plasma deposition apparatus, the exact nature and composition of the material deposited typically depends on one or more of the following conditions: (i) the plasma gas selected; (ii) the particular precursor compound(s) used; (iii) the amount of precursor compound(s) (which may be determined by the combination of the pressure of precursor compound(s), the flow rate and the manner of gas injection); (iv) the ratio of precursor compound(s); (v) the sequence of precursor compound(s); (vi) the plasma pressure; (vii) the plasma drive frequency; (viii) the power pulse and the pulse width timing; (ix) the coating time; (x) the plasma power (including the peak and/or average plasma power); (xi) the chamber electrode arrangement; and/or (xii) the preparation of the incoming assembly. The above factors also influence other types of plasma processing.

Typically the drive frequency of the power source 5 is 1 kHz to 4 GHz. Typically the plasma power density is 0.001 to 50 W/cm2, preferably 0.01 W/cm2 to 0.02 W/cm2, for example about 0.0175 W/cm2. Typically the mass flow rate is 5 to 1000 sccm, preferably 5 to 20 sccm, for example about 10 sccm. Typically the operating pressure is 0.1 to 1000 Pa (0.001 to 10 mbar), preferably 1 to 100 Pa (0.01 to 1 mbar), for example about 70 Pa (0.7 mbar). Typically the coating time is 10 seconds to >60 minutes, for example 10 seconds to 60 minutes.

Plasma processing can be easily scaled up, by using a larger process chamber 2. However, as a skilled person will appreciate, the preferred conditions will be dependent on the size and geometry of the process chamber 2. Thus, depending on the specific process chamber 2 that is being used, it may be beneficial for the skilled person to modify the operating conditions.

The plasma processing apparatus may comprise a substrate mount 7 within the process chamber 2 for holding the substrate 8. In some cases, the substrate mount 7 may be an electrode, e.g. an electrically floating or electrically grounded electrode, or may be biased by a DC voltage. The substrate mount 7 may, in some embodiments, also function as the second electrode 4 described above. In other words, the second electrode 4, may be configured to hold the substrate 8. The surface of the substrate mount 7 may be preferably substantially sheet-shaped, e.g. a planar plate electrode. The substrate mount 7 may have a thickness of about 6 to 10 mm. The substrate mount 7 may be formed from metals or conducting metal alloys for example, aluminium.

The first electrode 3 and/or second electrode 4 may be selectively switchable between a grounded configuration and an AC driven configuration, as shown in FIG. 1. The substrate mount may be selectively switchable between a grounded configuration, an AC driven configuration and a DC driven configuration, as shown in FIG. 1. The process chamber 2 may be grounded.

As shown in FIG. 1, the substrate mount 7 of the present invention comprises a surface having a plurality of apertures 7A formed therein. The inventors, found that a substrate mount 7 with apertures formed in it, providing through-holes in the substrate mount 7, had the surprising technical effect of the processing of the substrate. The mechanism by which this technical effect is achieved is thought to be due to increased flow of plasma 7 from one side of the substrate mount to the other.

Figure 2:
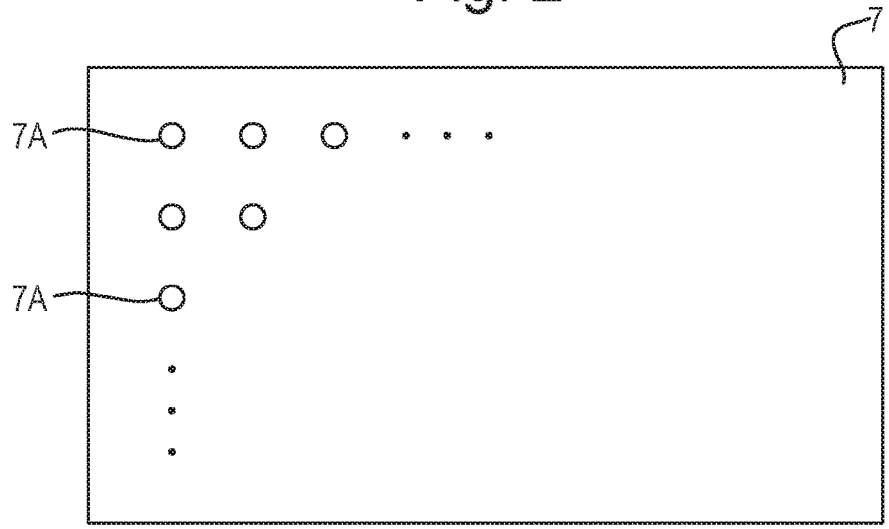

FIGS. 2 and 3 show example substrate mounts 7 in which the apertures 7A are circular in cross-section. As shown in FIG. 2 the apertures 7A may be arranged in a square grid configuration, e.g. in which the apertures 7A are arranged at the centres of tightly arranged squares. Alternatively, as shown in FIG. 3 the apertures 7A may be arranged in a hexagonal grid configuration, e.g. in which the apertures 7A are arranged at the centre of tightly arranged hexagons.

FIG. 4 shows an example substrate mount 7 in which the apertures 7A are square. As, shown in FIG. 4, the apertures 7A are arranged in a square grid configuration. The dimensions of the substrate mount 7 material between the apertures may be the same on each side of the square apertures 7A.

Apertures, with other cross-sectional shapes and arranged in other configurations may be provided also, e.g. elliptical, rectangular or triangular apertures. Preferably though, the apertures 7A may be substantially uniformly distributed over the surface of the substrate mount 7. In some cases, e.g. double sided processing where two opposing sides of the substrate are processed simultaneously, the substrate may be located in a cut-out portion of the substrate mount (distinct from the apertures 7A) such that both sides of the substrate are exposed to the plasma. In this case, the apertures 7A being substantially uniformly distributed over the surface of the substrate mount 7 refers to the surface of the substrate mount 7 surrounding the cut-out portion (i.e. surrounding the substrate).

The width of the apertures may be selected so as to substantially correspond to a thickness of a plasma sheath formed on the substrate mount 7 by the plasma 6 in the plasma chamber 2. The term width here is used to refer to a dimension of the cross-section of the aperture, in particular the diameter of inscribed circle of the cross-section of the aperture 7A. Therefore, in the case of a circular aperture 7A, it is the diameter of the circle, and in the case of a square aperture 7A, it is the length of one side of the square.

The apertures in the substrate mount 7 influence the plasma kinetics by providing an access for plasma species to move from one side of the substrate mount 7 to the other. This may improve the uniform distribution of plasma species in the process chamber 2. Hoverer surprisingly, for a given plasma the aperture size is a deciding factor on the selectivity and on the number of species that can pass through the apertures 7A. The choice of proper aperture width is also an important factor for controlling arcing/light-ups within the apertures 7A. Light-ups and arcing directly affect the coating uniformity and quality.

The preferred aperture width can be determined based on the thickness of a plasma sheath formed on the substrate mount 7. If the calculation is simplified by assuming a collisionless plasma, the thickness of the plasma sheath, $S_t$, has the following relation (1) where $\lambda_d$ is the Debye length of the plasma, $q_e$ is the electron charge, V is the electrode voltage amplitude (this is directly proportional to the voltage of the plasma sheath) and $T_e$ is the electron temperature. See Yu. P. Raizer, Gas Discharge Physics, Springer-Verlag, 1997; and Yu. P. Raizer, M. N, Schneider, N. A. Yatsenko, Radio-frequency capacitive discharge, CRC Press London, 1995.

$$S_i = \lambda_d [q_e V T_e]^{3/4} \quad (1)$$

A plasma sheath is a thin electrically (usually positively) charged layer which surrounds any surface exposed to a plasma. Plasma sheaths are typically generated due to the difference in the kinetics of electrons and ions. A surface exposed to plasma typically becomes negatively charged due to the initial high flux of relatively "light" electrons, compared to relatively heavy ions. As a result, positive species are attracted towards that surface and negative charges are repelled, forming a thick positive charged layer or sheath. The sheath screens the influence of any surface in contact with the plasma and the thickness of the sheath layer is dependent on the parameters as described in relation (1) above. In the plasma sheath (and pre-sheath) the electrons and ions compete, whereas, the neutrals can easily move through the sheath. In moving through the sheath, the neutrals may even get ionized.

Theoretically, sheath thickness calculation is very involving and especially in collisional plasmas, e.g. those typically used for plasma deposition. The above relation (1) is simplified with a collision less sheath assumed.

If the width of the apertures 7A is such that sheaths formed on opposite internal surfaces of the apertures 7A overlap, in other words if the width of the apertures 7A is smaller than twice the sheath thickness, arcing/light-ups may be more likely. Therefore, preferably, the width of the apertures 7A is smaller than twice the sheath thickness.

On the other hand, if the width of the apertures 7A is such that sheaths formed on opposite internal surfaces of the apertures 7A are substantially spaced apart, in other words, if the width of the apertures 7A is substantially larger (e.g. 10% or above) than twice the sheath thickness then ions, electrons, and neutrals can conduct through too easily. With such uncontrolled movement of plasma species, less improvement was found on processing uniformity.

Surprisingly, when the width of the apertures 7A is substantially the same as, or slightly greater (e.g. 2-10% greater) than, twice the sheath thickness, the chances of arcing/light-ups is minimised and the particle movement across the hole is controlled. Within the sheath, the ions and electrons compete and the flux is directed to the surface covered by the sheath, whereas, the neutrals can easily pass through.

In a typical plasma processing apparatus, the apertures 7A may preferably have a width of at most 15 mm or preferably still a width of at most 10 mm. The apertures 7A may preferably have a width of at least 1 mm or preferably still a width of at least 3 mm. For example, the apertures 7A may have a width of 7 mm, 8 mm, or 9 mm, most preferably 8 mm.

FIGS. 5 to 8 shows the results of experiments carried out using a typical plasma deposition apparatus with different combinations of electrodes 3, 4 and substrate mounts 7. In the experiments, deposition rate was measured using Spectroscopic Ellipsometer (SE) and Profilometer. Material properties like chemical/bond attributions were measured using Fourier Transformed Infrared (FTIR) spectroscopy. Surface energy was measured using a contact angle goniometer and liquid ingress immersion test on a coated PCB using Auto-SIR tester.

The graphs show the variation in the thickness of a material coating formed on a substrate 8 in different locations in the plasma chamber 2. FIGS. 7 and 8 respectively show different thicknesses in a front-back and left-right direction of the chamber. Triangles in FIGS. 7 and 8 represent results for solid (without apertures) RF electrodes 3, 4 and a solid (without apertures) grounded substrate mount 7. Circles represent results for mesh (square apertures) RF electrodes 3, 4 and a solid (without apertures) grounded substrate mount 7. Diamonds represent results for solid (without apertures) RF electrodes 3, 4 and a mesh (square apertures) grounded substrate mount 7. Squares represent results for perforated (circular apertures) RF electrodes 3, 4 and a mesh (square apertures) grounded substrate mount 7. By comparison to FIGS. 5 and 6, which show results for a comparative example solid substrate, it is shown that the substrate holder with apertures results in improved coating uniformity.

In addition to apertures 7A in the substrate mount 7, one or more of the electrodes 3, 4 of the plasma source described above may comprise a plurality of apertures. The apertures may be provided having one of the shapes and/or configurations described above in relation to the apertures 7A of the substrate mount 7. Such an arrangement has been found to further improve coating uniformity.

The invention claimed is:

1. A plasma processing apparatus for processing a substrate using a plasma, comprising:
   a process chamber in which the processing takes place;
   a plasma source for providing a plasma to the process chamber;
   a substrate mount within the process chamber for holding the substrate on a surface of the substrate mount, the surface having a plurality of apertures, wherein the apertures are through-holes extending through an entire thickness of the substrate mount, wherein the through-holes are open spaces without any physical structure within the through-holes, the through-holes configured to increase flow of plasma from a first side of the substrate mount to a second side of the substrate mount.

2. The plasma processing apparatus of claim 1 wherein a width of the apertures substantially corresponds to twice the thickness of a plasma sheath formed on the substrate mount.

3. The plasma processing apparatus of claim 1, wherein the plurality of apertures are arranged in a two dimensional grid configuration.

4. The plasma processing apparatus of claim 3, wherein each aperture includes at least two nearest neighbor apertures spaced an equal distance from the each aperture.

5. The plasma processing apparatus of claim 4, wherein the two dimensional grid is a square grid configuration.

6. The plasma processing apparatus of claim 4, wherein the two dimensional grid is a hexagonal grid configuration.

7. The plasma processing apparatus of claim 4, wherein the apertures have a width between 1 mm and 15 mm.

8. The plasma processing apparatus of claim 1, wherein the apertures in the substrate mount are substantially circular.

9. The plasma processing apparatus of claim 1, wherein the apertures in the substrate mount are substantially square, and wherein the plurality of apertures are arranged in a two dimensional grid configuration, wherein the two dimensional grid is a square grid configuration.

10. The plasma processing apparatus of claim 1, wherein the apertures are substantially uniformly distributed over the surface of the substrate mount in a two dimensional grid configuration.

11. The plasma processing apparatus of claim 1, wherein the surface of the substrate mount is substantially sheet-shaped, and wherein a width of the apertures is greater than a thickness of the substrate mount.

12. The plasma processing apparatus of claim 1, wherein the substrate mount is a grounded electrode.

13. The plasma processing apparatus of claim 1, wherein the substrate mount is a floating electrode.

14. The plasma processing apparatus of claim 1, further comprising at least one RF electrode for providing an electric field within the process chamber.

15. The plasma processing apparatus of claim 14, wherein the RF electrode comprises a plurality of apertures.

16. A plasma processing apparatus for processing a substrate using a plasma, comprising:
 a process chamber in which the processing takes place;
 a plasma source for providing a plasma to the process chamber;
 a substrate mount within the process chamber for holding the substrate on a surface of the substrate mount, the surface having a plurality of apertures, wherein the apertures are through-holes extending through an entire thickness of the substrate mount, wherein the through-holes are open spaces without any physical structure within the through-holes, the through-holes configured to increase flow of plasma from a first side of the substrate mount to a second side of the substrate mount, wherein the substrate mount is a floating electrode; and
 wherein the apertures are substantially uniformly distributed over the surface of the substrate mount in a two dimensional grid configuration,
 wherein a width of the apertures is greater than a thickness of the substrate mount.

* * * * *